United States Patent
Ozaki et al.

(10) Patent No.: US 8,853,530 B2
(45) Date of Patent: Oct. 7, 2014

(54) CONCENTRATOR PHOTOVOLTAIC UNIT AND APPARATUS

(75) Inventors: Kouki Ozaki, Inuyama (JP); Masao Hiramatsu, Inuyama (JP)

(73) Assignee: Daido Metal Company Ltd., Nagoya (JP)

( * ) Notice: Subject to any disclaimer, the term of this patent is extended or adjusted under 35 U.S.C. 154(b) by 543 days.

(21) Appl. No.: 13/279,594

(22) Filed: Oct. 24, 2011

(65) Prior Publication Data

US 2012/0145221 A1    Jun. 14, 2012

(30) Foreign Application Priority Data

Dec. 10, 2010 (JP) .................................. 2010-276438

(51) Int. Cl.
*H01L 31/052* (2014.01)
*H01L 31/048* (2014.01)

(52) U.S. Cl.
CPC ............ *H01L 31/0524* (2013.01); *Y02E 10/52* (2013.01); *H01L 31/0525* (2013.01); *H01L 31/052* (2013.01); *H01L 31/048* (2013.01)
USPC .......................................... 136/259; 136/246

(58) Field of Classification Search
USPC .................................................. 136/259, 246
See application file for complete search history.

(56) References Cited

U.S. PATENT DOCUMENTS

| | | | | |
|---|---|---|---|---|
| 4,024,397 A | * | 5/1977 | Weiner ....................... | 250/338.1 |
| 4,055,761 A | * | 10/1977 | Shimomura ................... | 250/239 |
| 4,830,678 A | * | 5/1989 | Todorof et al. ............... | 136/259 |
| 5,977,475 A | * | 11/1999 | Hibino .......................... | 136/246 |

FOREIGN PATENT DOCUMENTS

JP        2008-4661 A        10/2008

* cited by examiner

*Primary Examiner* — Golam Mowla
(74) *Attorney, Agent, or Firm* — Browdy and Neimark, PLLC

(57) ABSTRACT

There is provided a concentrator photovoltaic unit and apparatus in which light collecting efficiency is hardly reduced and sealing ability is hardly deteriorated while using a resin lens and a metal case. After attaching a homogenizer and a photovoltaic element a holding member, a Fresnel lens is attached to a case to close an opening at an upper end portion of the case, and the holding member is attached to the case to close an opening at a lower end portion of the case, so that one concentrator photovoltaic unit in which the photovoltaic element is accommodated is manufactured.

12 Claims, 5 Drawing Sheets

CONCENTRATOR PHOTOVOLTAIC UNIT AND APPARATUS

BACKGROUND OF THE INVENTION

1. Field of the Invention

The present invention relates to a concentrator photovoltaic unit including a lens made of resin for collecting sunlight, a photovoltaic element for generating electric power upon receiving the light collected by the resin lens, a frame-like case made of metal having openings at both end portions and a space formed therein, and a holding member for holding the photovoltaic element, and a concentrator photovoltaic apparatus in which a plurality of concentrator photovoltaic units are arranged.

2. Description of Related Art

Conventionally, a concentrator photovoltaic apparatus including a plurality of Fresnel lenses for collecting sunlight and a case used to be inclined so as to direct the plurality of Fresnel lenses toward the sun has been commercialized, and the case has a plurality of solar cells therein for respectively generating electric power upon receiving the light collected by the respective Fresnel lenses. In the concentrator photovoltaic apparatus, the plurality of Fresnel lenses are used as an upper member of the case to thereby create a space for accommodating the plurality of solar cells in the case. Further, to improve a sealing property of the space inside the case, the respective resin Fresnel lenses are bonded together with an adhesive, and the plurality of resin Fresnel lenses bonded together are fixed to an opening portion of the metal case by a fixing member, so that dust or water is prevented from entering the case (for example, see JP-A-2008-4661). As a Fresnel lens, the one having a flat or spherical shape is used therein.

BRIEF SUMMARY OF THE INVENTION

In the concentrator photovoltaic apparatus disclosed in JP-A-2008-4661, the Fresnel lens is formed in a quadrangular shape. Since the respective resin Fresnel lenses are bonded together with the adhesive, and the plurality of resin Fresnel lenses bonded together are fixed to the opening portion of the metal case by the fixing member, all four sides of an outer peripheral portion of the Fresnel lens are restricted by the adhesive or the fixing member. Further, since the solar cell generates heat to cause heat accumulation when generating electric power from sunlight, the resin Fresnel lens thermally expands. At this time, however, the resin Fresnel lens thermally expands by different amounts in a direction between two sides of the quadrangular shape and in a diagonal direction of the quadrangular shape. While the metal case also thermally expands during the power generation from sunlight, the metal case has a smaller thermal expansion amount than that of the resin Fresnel lens. Accordingly, when the plurality of resin Fresnel lenses thermally expand while being restricted in the opening portion of the metal case, a compression stress is applied to the resin Fresnel lenses, so that the resin Fresnel lenses are elastically deformed, to cause warpage or distortion therein. Thus, in the concentrator photovoltaic apparatus, a distance between the solar cells may be changed, or a sunlight collecting position may be shifted so that light collecting efficiency may be reduced.

Further, the concentrator photovoltaic apparatus is used at different environmental temperatures in the daytime in which the electric power is generated and in the nighttime in which the power generation is suspended. Thus, a stress may be locally applied to a connection portion between the respective Fresnel lenses using the adhesive due to a difference in thermal expansion between the resin Fresnel lens and the metal case during a thermal cycle with a temperature difference. The sealing property of the space inside the case may be thereby deteriorated. In particular, when the opening portion of the case has a rectangular shape, or a plurality of Fresnel lenses are restricted in one case, the influence of the thermal expansion difference between the resin Fresnel lens and the metal case is increased. Accordingly, the light collecting efficiency is further reduced, and the sealing property is further deteriorated.

The present invention has been made in view of the aforementioned circumstances, and it is an object of the present invention to provide a concentrator photovoltaic unit and apparatus in which light collecting efficiency is hardly reduced and sealing property is hardly deteriorated while using a resin Fresnel lens and a metal case.

To achieve the above object, an invention according to a first aspect provides a concentrator photovoltaic unit including: a lens made of resin for collecting sunlight; a photovoltaic element which generates electric power upon receiving the light collected by the resin lens; a frame-like case made of metal having openings at both end portions and a space formed therein; and a holding member for holding the photovoltaic element, characterized in that an outer peripheral portion of the resin lens has a circular or regular polygonal shape, the opening of at least one of the end portions of the metal case has the same shape as the outer peripheral portion of the resin lens, a center position of the outer peripheral portion of the resin lens and a center position of the opening of the one end portion of the metal case are formed concentrically with each other, and the concentrator photovoltaic unit is unitized by attaching the outer peripheral portion of the single resin lens to the opening of the one end portion of the metal case to abut against the metal case so that the light is focused onto the photovoltaic element, and by attaching the holding member to the opening of the other end portion of the metal case so that the photovoltaic element is accommodated in the metal case.

An invention according to a second aspect is characterized in that, in the concentrator photovoltaic unit according to the first aspect, the resin lens has a shape bulging out in a direction facing an incident direction of the sunlight.

An invention according to a third aspect is characterized in that, in the concentrator photovoltaic unit according to the first or second aspect, the opening of the one end portion of the metal case is formed to project from a position against which the outer peripheral portion of the resin lens abuts.

An invention according to a fourth aspect is characterized in that a plurality of the concentrator photovoltaic units according to any one of the preceding aspects are arranged as a concentrator photovoltaic apparatus so as to be detachable on a mounting member to form a space between the metal cases of the adjacent concentrator photovoltaic units.

An invention according to a fifth aspect is characterized in that, in the concentrator photovoltaic apparatus according to the fourth aspect, the metal cases are formed such that the space formed between the metal cases of the concentrator photovoltaic units becomes gradually wider from the opening of the one end portion of the metal case toward the opening of the other end portion of the metal case.

In the invention according to the first aspect, since the single resin lens is attached to each single metal case to form one unit, it is not necessary to bond a plurality of resin lenses together as in a conventional concentrator photovoltaic apparatus, and even when warpage or distortion occurs in the resin lens due to the difference in thermal expansion between the resin lens and the metal case, the resin lens in another unit is not affected. Further, since only one resin lens is held in the opening of the metal case unlike the conventional concentrator photovoltaic apparatus, a focus position of the sunlight by the resin lens is hardly shifted in an axial direction, and light collecting efficiency is also hardly reduced. Further, it is also possible to design the focus position of the sunlight by the resin lens taking account of an operating environment of the concentrator photovoltaic unit and a temperature change due to heat accumulation during power generation.

Further, a stress may be generated on an abutment portion between the resin lens and the metal case due to the thermal expansion difference therebetween. However, by forming the outer peripheral portion of the resin lens to have the circular or regular polygonal shape, the difference in stress along the entire periphery of the abutment portion is reduced. Accordingly, in the abutment portion between the resin lens and the metal case, the stress due to the thermal expansion difference is dispersed, a local stress is hardly generated, and the abutment portion is hardly damaged. Thus, the space inside the metal case can be kept hermetically sealed for a long time.

Further, in the invention according to the second aspect, since the resin lens has the shape bulging out in the direction facing the incident direction of sunlight, even when warpage occurs in the resin lens due to the thermal expansion difference between the resin lens and the metal case, the warpage always occurs in the direction facing the incident direction of sunlight. Accordingly, the focus position of the sunlight by the resin lens can be easily designed while taking account of the operating environment of the concentrator photovoltaic unit and the temperature change due to the heat accumulation during the power generation.

Further, in the invention according to the third aspect, since the opening of the one end portion of the metal case is formed to project from the position against which the outer peripheral portion of the resin lens abuts, attachment accuracy between the resin lens and the metal case is not required as compared to a case in which the opening of the one end portion of the metal case corresponds to the outer peripheral portion of the resin lens, and therefore the concentrator photovoltaic unit can be manufactured at lower cost.

Further, in the invention according to the fourth aspect, since the plurality of concentrator photovoltaic units are arranged as the concentrator photovoltaic apparatus so as to be detachable on the mounting member to form the space between the metal cases of the adjacent concentrator photovoltaic units, the heat accumulated during the power generation in each of the concentrator photovoltaic units can be dissipated through the space. In addition, even when the concentrator photovoltaic apparatus in which the plurality of concentrator photovoltaic units are arranged on the mounting member is installed outdoors, wind can easily pass through the space, and therefore the concentrator photovoltaic apparatus has excellent resistance to wind. Moreover, each concentrator photovoltaic unit can be mounted or replaced unlike the conventional concentrator photovoltaic apparatus. Accordingly, the concentrator photovoltaic apparatus can be easily handled during installation.

Furthermore, in the invention according to the fifth aspect, since the metal cases are formed such that the space formed between the metal cases of the concentrator photovoltaic units becomes gradually wider from the opening of the one end portion of the metal case toward the opening of the other end portion of the metal case, a wide space is provided at the opening of the other end portion of the metal case, that is, on the mounting member side, so that wind more easily passes through the space when the concentrator photovoltaic apparatus is installed outdoors. Accordingly, the concentrator photovoltaic apparatus having excellent resistance to wind can be achieved.

DETAILED DESCRIPTION OF THE INVENTION

Figure 1:
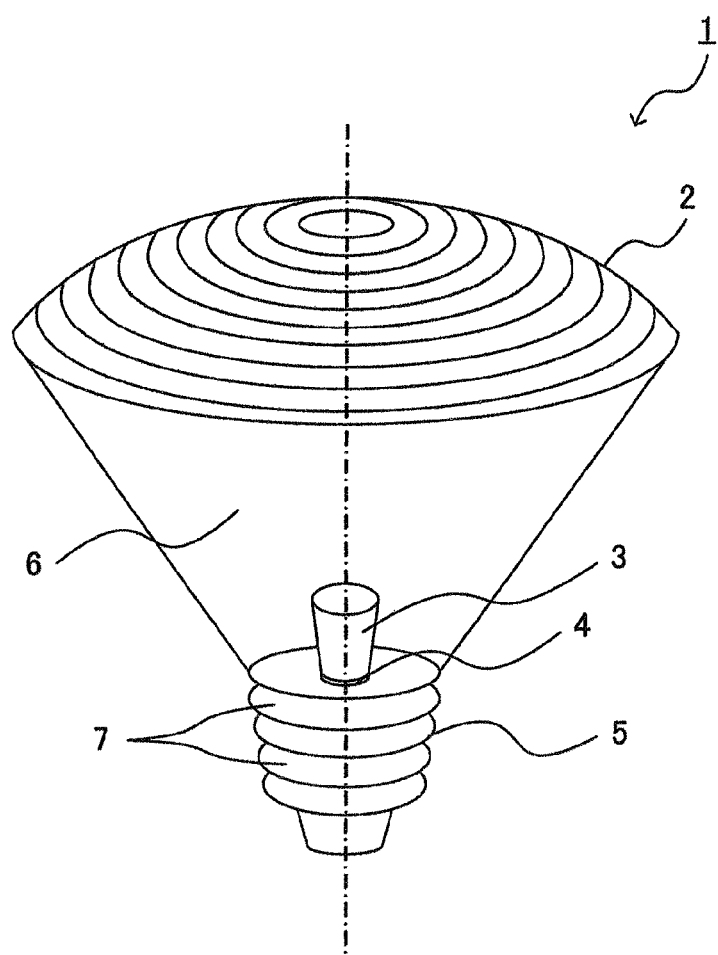
FIG. 1 is a perspective view of a concentrator photovoltaic unit.
Figure 2:
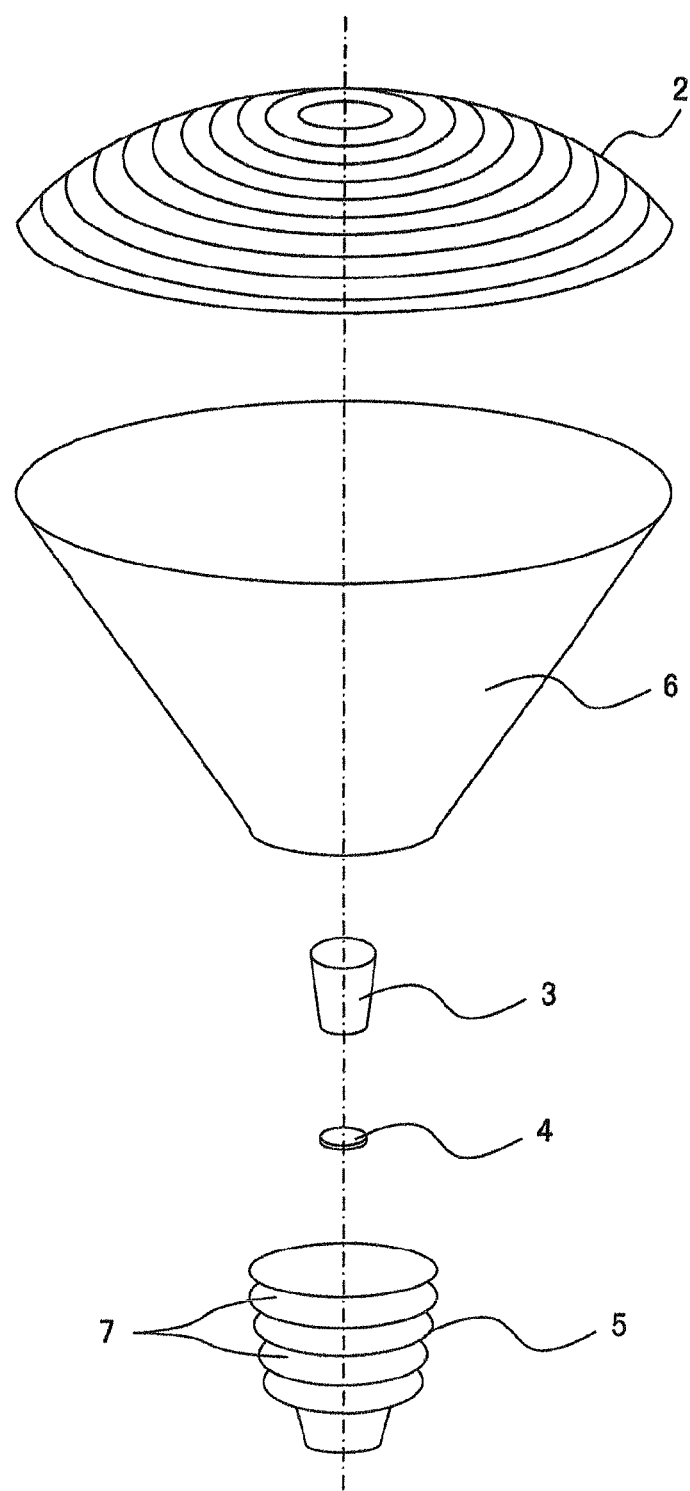
FIG. 2 is an exploded perspective view of the concentrator photovoltaic unit.

In the following, an embodiment of the present invention will be described with reference to FIGS. 1 and 2. FIG. 1 is a perspective view of a concentrator photovoltaic unit 1. FIG. 2 is an exploded perspective view of the concentrator photovoltaic unit 1. It should be noted that the above drawings are merely schematic views of the concentrator photovoltaic unit 1 according to the embodiment, and each portion is exaggerated or omitted for easy understanding of the configuration or structure.

As shown in FIGS. 1 and 2, the concentrator photovoltaic unit 1 according to the embodiment of the present invention includes a spherical Fresnel lens 2 made of resin (a primary optical system) that collects sunlight, a homogenizer 3 (a secondary optical system) that homogenizes the intensity of the light collected by the Fresnel lens 2 and guides the light to a photovoltaic element 4, the photovoltaic element 4 that generates electric power upon receiving the light collected by the Fresnel lens 2 and the homogenizer 3, a holding member 5 that holds the homogenizer 3 and the photovoltaic element 4, and a case 6 made of metal to which the Fresnel lens 2 and the holding member 5 are attached, to form one unit.

The Fresnel lens 2 has a spherical front surface, and a concavo-convex (or uneven) rear surface with stair-like annular steps. By this configuration, the received light is collected onto the photovoltaic element 4. The Fresnel lens 2 is made of a resin material having excellent optical properties, e.g. acrylic resin.

The homogenizer 3 is arranged at such a position as to collect the light from the Fresnel lens 2 onto an upper surface thereof (or a surface on the Fresnel lens 2 side). A light receiving surface (an upper surface) of the photovoltaic element 4 is attached in contact with a lower surface of the homogenizer 3. By this configuration, the light collected by the Fresnel lens 2 can be guided to the photovoltaic element 4 while homogenizing the intensity of light. Although the concentrator photovoltaic unit 1 according to the embodiment of the present invention includes the homogenizer 3, the concentrator photovoltaic unit 1 may not include the homogenizer 3. In this case, the photovoltaic element 4 may be arranged at such a position as to directly collect the light from the Fresnel lens 2 onto the light receiving surface of the photovoltaic element 4.

The photovoltaic element 4 consists of a multi-junction photovoltaic element, which is configured to generate electric power upon receiving the light collected by the Fresnel lens 2 and the homogenizer 3 at the light receiving surface, and output the electric power generated in the photovoltaic element 4 to the outside through a line (not shown) formed in the holding member 5. The photovoltaic element 4 and the homogenizer 3 are attached to the holding member 5.

A heat dissipation portion 7 having a plurality of concentric annular cooling fins is formed in a side portion of the holding member 5. By this configuration, the holding member 5 has a larger area in contact with the outside by a surface area of the heat dissipation portion 7, to thereby improve a heat dissipation effect of the holding member 5. In other words, heat accumulated by the light collected onto the photovoltaic element 4 can be dissipated through the holding member 5 to which a rear surface of the photovoltaic element 4 is attached to be in contact therewith. Although concentric annular cooling fins are illustrated as the heat dissipation portion 7, any shape may be employed as long as the area of the holding member 5 in contact with the outside is increased. For example, the heat dissipation portion 7 may have a shape in which a part of the holding member 5 projects.

The case 6 has openings in upper and lower end portions. The case 6 is formed in a circular conical shape such that an inner space becomes gradually narrower from the opening in the upper end portion toward the opening in the lower end portion. An outer peripheral portion of the Fresnel lens 2 is formed in a circular shape as viewed from an axial centerline direction. The opening in the upper end portion of the case 6 is formed in a shape substantially corresponding to the outer peripheral portion of the Fresnel lens 2. Meanwhile, an outer peripheral portion of an upper surface of the holding member 5 is formed in a circular shape. The opening in the lower end portion of the case 6 is formed in a shape substantially corresponding to the outer peripheral portion of the upper surface of the holding member 5. The case 6 is made of a metal material which can be machined, e.g. aluminum or stainless steel. Although FIGS. 1 and 2 show the circular conical case 6, any shape may be employed as long as the space for accommodating the photovoltaic element 4 is provided therein. For example, another conical shape such as a pyramid, or another columnar shape such as a cylindrical body and a prismatic body may be also employed.

After the homogenizer 3 and the photovoltaic element 4 are attached to the holding member 5, the Fresnel lens 2 is attached to the case 6 having the aforementioned configuration so as to close the opening in the upper end portion, and the holding member 5 is attached to the case 6 so as to close the opening in the lower end portion. The space inside the case 6 is thereby hermetically sealed. One concentrator photovoltaic unit 1 in which the photovoltaic element 4 is accommodated can be thereby manufactured. When the Fresnel lens 2 is attached to the case 6, a center position of the outer peripheral portion of the Fresnel lens 2 is provided concentrically with a center position of the opening in the upper end portion of the case 6. Since the single Fresnel lens 2 is attached to the single case 6 to form one unit as described above, it is not necessary to bond a plurality of Fresnel lenses 2 together like a conventional concentrator photovoltaic apparatus. Even when warpage or distortion occurs in the Fresnel lens 2 due to the difference in thermal expansion between the resin Fresnel lens 2 and the metal case 6, another concentrator photovoltaic unit 1 is not affected thereby. Since only one Fresnel lens 2 is held in the opening of the case 6 unlike the conventional concentrator photovoltaic apparatus, a focus position of sunlight by the Fresnel lens 2 is hardly shifted in an axial direction, and light collecting efficiency is also hardly reduced. The focus position of the sunlight by the Fresnel lens 2 can be designed while considering an operating environment of the concentrator photovoltaic unit 1 and a temperature change due to the heat accumulation during the power generation.

A stress may be generated on a connection portion where the Fresnel lens 2 is attached to the case 6 due to the thermal expansion difference between the resin material and the metal material. However, since the outer peripheral portion of the Fresnel lens 2 has the circular shape, an equal stress is applied to the entire periphery of the connection portion. Thus, since the stress due to the thermal expansion difference is dispersed, the stress is not locally applied to the connection portion between the Fresnel lens 2 and the case 6. The connection portion is thereby hardly damaged. Accordingly, the space inside the case 6 can be kept hermetically sealed for a long time.

The spherical Fresnel lens 2 is formed in a shape bulging out in a direction facing an incident direction of the sunlight when attached to the case 6. By this configuration, even when warpage occurs in the Fresnel lens 2 due to the thermal expansion difference between the resin Fresnel lens 2 and the metal case 6, the warpage always occurs in the direction facing the incident direction of the sunlight. Thus, it is easy to design the focus position of the sunlight by the Fresnel lens 2 while taking account of the operating environment of the concentrator photovoltaic unit 1 and the temperature change due to the heat accumulation during the power generation.

When the sealed space is formed inside the case 6 with the Fresnel lens 2 and the holding member 5 being attached to the case 6, the space is preferably in a vacuum state or filled with inert gas. By this configuration, no dew condensation occurs inside the case 6. Thus, the light collected by the Fresnel lens 2 is not diffusely reflected. The light can be thereby stably collected onto the photovoltaic element 4, so that power generation efficiency of the photovoltaic element 4 can be prevented from being reduced. In a case in which much heat is accumulated during the power generation of the concentrator photovoltaic unit 1, an air hole may be formed in a side surface of the case 6.

Figure 3A:
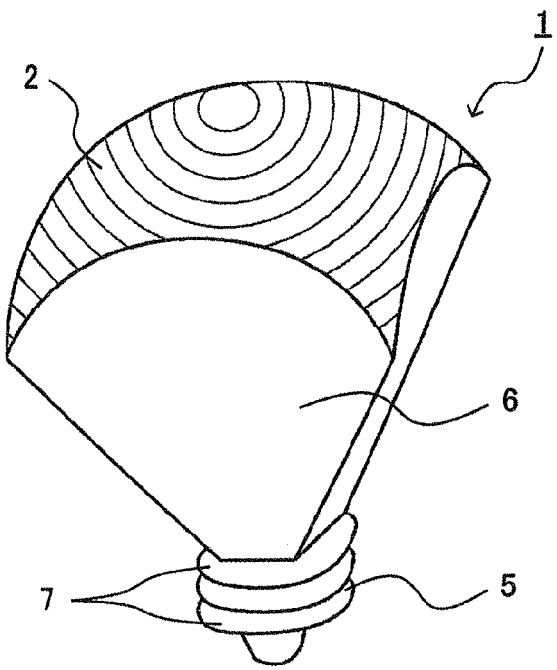
FIG. 3A is a perspective view of a concentrator photovoltaic unit using a case having a pyramid shape in which an opening of an upper end portion of the case corresponds to an outer peripheral portion of a Fresnel lens.
Figure 3B:
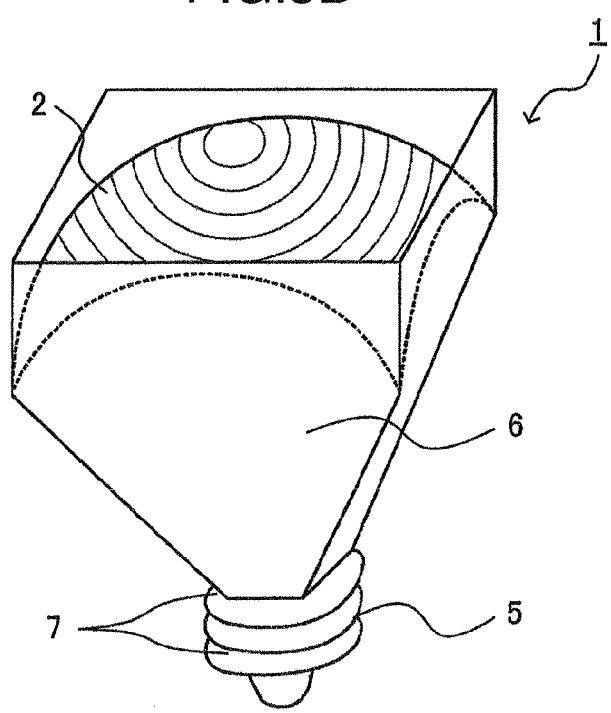
FIG. 3B is a perspective view of a concentrator photovoltaic unit using a case having a pyramid shape in which the opening of an upper end portion of the case projects from the outer peripheral portion of the Fresnel lens.

Next, a concentrator photovoltaic unit 1 in which a case 6 has a different shape from that of the aforementioned concentrator photovoltaic unit 1 will be described with reference to FIGS. 3A and 3B. FIG. 3A is a perspective view of a concentrator photovoltaic unit 1 using a case 6 having a pyramid shape in which an opening in an upper end portion of the case 6 corresponds to an outer peripheral portion of the Fresnel lens 2. FIG. 3B is a perspective view of a concentrator photovoltaic unit 1 using a case 6 having a pyramid shape in which an opening in an upper end portion of the case 6 projects from an outer peripheral portion of the Fresnel lens 2. The same reference numerals are assigned to members having the same functions as those of the aforementioned concentrator photovoltaic unit 1.

As long as the space for accommodating the photovoltaic element 4 is provided inside the case 6, the pyramid-shaped case 6 as shown in FIG. 3A may be used in addition to the circular conical case 6 described using FIGS. 1 and 2. While the outer peripheral portion of the Fresnel lens 2 is formed in a regular quadrangular (square) shape as viewed from the axial centerline direction, the opening in the upper end portion of the case 6 is formed in a shape substantially corresponding to the outer peripheral portion of the Fresnel lens 2. The outer peripheral portion of the Fresnel lens 2 preferably has the circular shape. However, as long as the shape is axisymmetric, a regular polygonal shape such as a regular quadrangular shape as viewed from the axial centerline direction may be also employed. In this case, the stress may be also generated on the connection portion where the Fresnel lens 2 is attached to the case 6 due to the thermal expansion difference between the resin material and the metal material. However, since the outer peripheral portion of the Fresnel lens 2 has the regular polygonal shape, a stress difference along the entire periphery of the connection portion is reduced. Thus, since the stress due to the thermal expansion difference is dispersed, the stress is not locally applied to the connection portion between the Fresnel lens 2 and the case 6. The connection portion is thereby hardly damaged. Accordingly, the space inside the case 6 can be kept hermetically sealed for a long time.

In addition to the shape of the case 6 in which the opening in the upper end portion of the case 6 is formed to correspond to the outer peripheral portion of the Fresnel lens 2, the opening in the upper end portion of the case 6 may be formed to project from the connection portion with the outer peripheral portion of the Fresnel lens 2 as shown in FIG. 3B. While the outer peripheral portion of the Fresnel lens 2 is formed in a regular quadrangular (square) shape as viewed from the axial centerline direction, a portion between the opening in the upper end portion of the case 6 and the connection portion with the outer peripheral portion of the Fresnel lens 2 is formed in a shape substantially corresponding to the outer peripheral portion of the Fresnel lens 2. By this configuration, attachment accuracy is not so required in order to attach the Fresnel lens 2 to the case 6 as compared to the case in which the opening in the upper end portion of the case 6 corresponds to the outer peripheral portion of the Fresnel lens 2. Accordingly, the concentrator photovoltaic unit 1 can be manufactured at lower cost.

Figure 4:
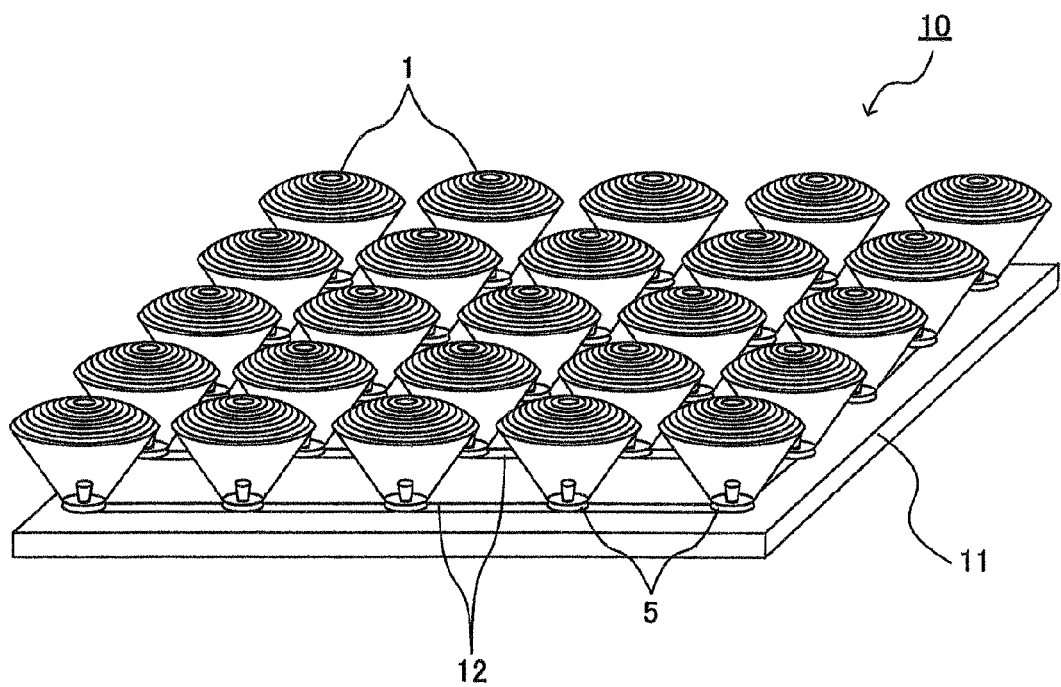
FIG. 4 is a perspective view illustrating a specific example of a concentrator photovoltaic apparatus in which a plurality of concentrator photovoltaic units are mounted.

Next, a concentrator photovoltaic apparatus 10 in which a plurality of concentrator photovoltaic units 1 according to an embodiment of the present invention are mounted will be described with reference to FIG. 4. FIG. 4 is a perspective view illustrating a specific example of the concentrator photovoltaic apparatus 10 in which a plurality of concentrator photovoltaic units 1 are mounted. It should be noted that the above drawing is merely a schematic view of the concentrator photovoltaic apparatus 10 according to the embodiment, and each portion is exaggerated or omitted for easy understanding of the configuration or structure.

First, five rail parts 12 on which five concentrator photovoltaic units 1 can be respectively mounted in a line are formed at equal intervals on a plate-like mounting member 11 that constitutes the concentrator photovoltaic apparatus 10. A predetermined portion of the holding member 5 of the concentrator photovoltaic unit 1 is fixed to the rail part 12 of the mounting member 11. Accordingly, the concentrator photovoltaic apparatus 10 in which a total of 25 concentrator photovoltaic units 1 are mounted with a space therebetween in length and width directions as shown in the drawing can be manufactured. By connecting the appropriate number of concentrator photovoltaic units 1, the concentrator photovoltaic apparatus 10 can output necessary electric power. A driving mechanism (not show) that allows the Fresnel lens 2 of the concentrator photovoltaic unit 1 to follow the sun so as to be always directed toward the sun is also attached to the mounting member 11 of the concentrator photovoltaic apparatus 10.

As described above, the plurality of concentrator photovoltaic units 1 are detachably arranged, as the concentrator photovoltaic apparatus 10, on the rail parts 12 of the mounting member 11 such that a space is formed between the cases 6 of the adjacent concentrator photovoltaic units 1. The heat accumulated during the power generation in each of the concentrator photovoltaic units 1 can be thereby dissipated through the space. When the concentrator photovoltaic apparatus 10 in which the plurality of concentrator photovoltaic units 1 are arranged on the mounting member 11 is installed outdoors, wind easily passes through the space. Thus, the concentrator photovoltaic apparatus 10 has excellent resistance to wind. Further, since each concentrator photovoltaic unit 1 can be independently mounted or replaced unlike the conventional concentrator photovoltaic apparatus, the concentrator photovoltaic apparatus 10 can be easily handled when constructed.

Although the plate-like mounting member 11 is employed as the mounting member of the concentrator photovoltaic unit 1 in the embodiment shown in the drawing, the present invention is not limited thereto. For example, as long as there is a space between the cases 6 of the adjacent concentrator photovoltaic units 1 when the plurality of concentrator photovoltaic units 1 are mounted on the mounting member 11, the mounting member 11 may have a rod-like shape or a shape with good design. Although the rail part 12 is employed as a mounting part of the concentrator photovoltaic unit 1 in the embodiment shown in the drawing, the present invention is not limited thereto. For example, as long as the concentrator photovoltaic units 1 can be attached/detached one by one to/from the mounting member 11, a socket type to which the holding member 5 of the concentrator photovoltaic unit 1 can be fitted may be also employed.

In the embodiment shown in the drawing, the case 6 is formed in the circular conical shape such that the inner space becomes gradually narrower from the opening in the upper end portion of the case 6 toward the opening in the lower end portion of the case 6 in each of the concentrator photovoltaic units 1 mounted in the concentrator photovoltaic apparatus 10. That is, the cases 6 are formed such that the space formed between the cases 6 of the adjacent concentrator photovoltaic units 1 becomes gradually wider from the opening in the upper end portion of the case 6 toward the opening in the lower end portion of the case 6 when the plurality of concentrator photovoltaic units 1 are mounted on the mounting member 11. By this configuration, even when the plurality of concentrator photovoltaic units 1 are arranged as the concentrator photovoltaic apparatus 10, a wide space is provided at the opening in the lower end portion of the case 6, that is, on the mounting member 11 side, so that wind more easily passes through the space when the concentrator photovoltaic apparatus 10 is installed outdoors. Accordingly, the concentrator photovoltaic apparatus 10 having excellent resistance to wind can be achieved.

Figure 5A:
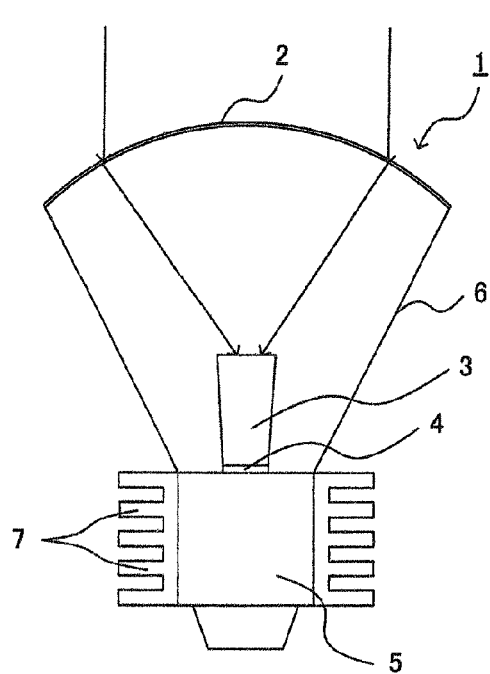
FIG. 5A is a side view of a concentrator photovoltaic unit in which a spherical Fresnel lens is used as an optical lens.
Figure 5B:
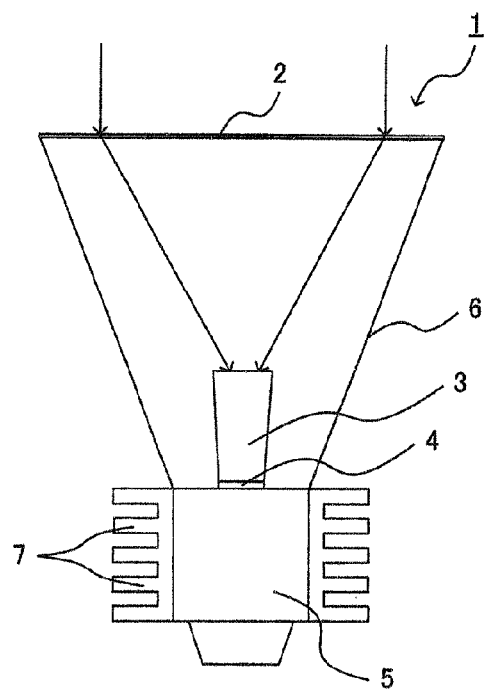
FIG. 5B is a side view of a concentrator photovoltaic unit in which a flat Fresnel lens is used as an optical lens.
Figure 5C:
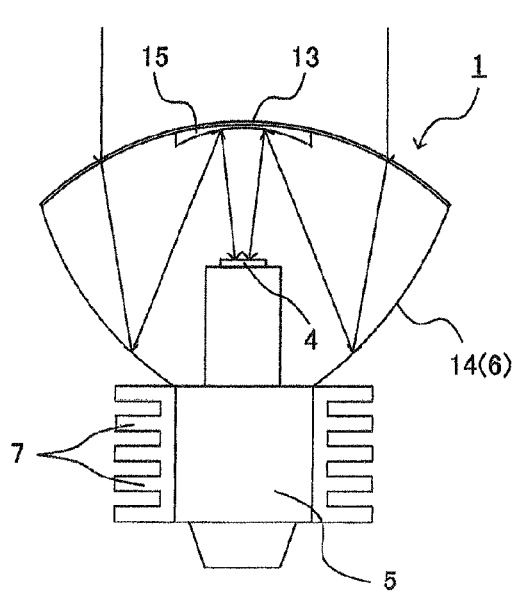
FIG. 5C is a side view of a concentrator photovoltaic unit in which a refractive lens having a spherical surface is used as an optical lens.
Figure 5D:
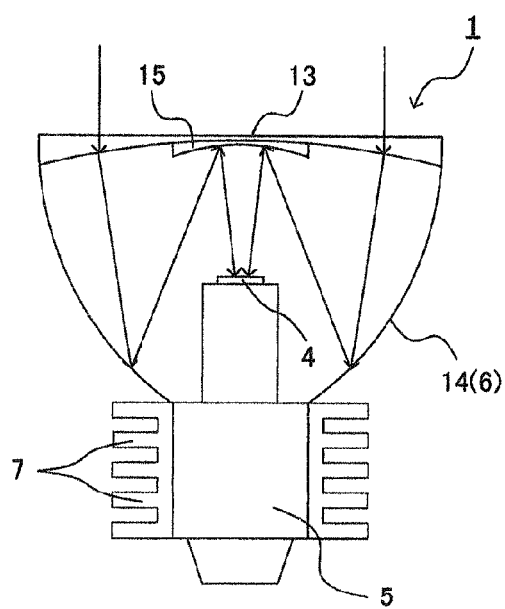
FIG. 5D is a side view of a concentrator photovoltaic unit in which a refractive lens having a flat surface is used as an optical lens.

Next, a concentrator photovoltaic unit 1 in which the optical lens has a different configuration from that of the aforementioned concentrator photovoltaic unit 1 will be described with reference to FIGS. 5A-5D. FIG. 5A is a side view of the concentrator photovoltaic unit 1 in which a spherical Fresnel lens 2 is used as an optical lens. FIG. 5B is a side view of a concentrator photovoltaic unit 1 in which a flat Fresnel lens 2 is used as an optical lens. FIG. 5C is a side view of a concentrator photovoltaic unit 1 in which a refractive lens 13 having a spherical surface is used as an optical lens. FIG. 5D is a side view of a concentrator photovoltaic unit 1 in which a refractive lens 13 having a flat surface is used as an optical lens. The same reference numerals are assigned to members having the same functions as those of the aforementioned concentrator photovoltaic unit 1.

As shown in FIG. 5A, by using the spherical Fresnel lens 2 in the concentrator photovoltaic unit 1 described using FIG. 1, the sunlight can be collected onto the homogenizer 3 when the Fresnel lens 2 is directed toward the sun. The Fresnel lens 2 may have any shape as long as the sunlight can be collected onto the homogenizer 3. The flat Fresnel lens 2 having concentric annular protrusions on its surface as shown in FIG. 5B may be also employed.

Besides the Fresnel lens 2, the refractive lens 13 having the spherical surface as shown in FIG. 5C may be also used as a general optical lens in the concentrator photovoltaic unit 1. However, since the refractive lens 13 refracts the sunlight at a smaller angle than the Fresnel lens 2 even when the refractive lens 13 is directed toward the sun, the refractive lens 13 cannot collect the sunlight at a short distance. To solve the problem, when the refractive lens 13 is used in the concentrator photovoltaic unit 1, a primary reflector 14 that reflects the light refracted by the refractive lens 13 and thereby collects the light is provided on an inner surface of the case 6, and a secondary reflector 15 that further reflects the light collected by the primary reflector 14 and thereby collects the light onto the photovoltaic element 4 is provided in a center portion of a rear surface of the refractive lens 13. By this configuration, even when the refractive lens 13 is used, the sunlight can be collected onto the photovoltaic element 4 at a short distance when the refractive lens 13 is directed toward the sun by using the light reflection by the primary reflector 14 and the secondary reflector 15. When the refractive lens 13 is used in the concentrator photovoltaic unit 1, the case 6 itself may function as the primary reflector 14. Thus, the case 6 may be formed in a bowl shape so as to reflect the light refracted by the refractive lens 13 and thereby collect the light onto the secondary reflector 15. As long as the light is directed to the primary reflector 14, the refractive lens 13 may have any shape. The refractive lens 13 having the flat surface as shown in FIG. 5D may be also used.

The invention claimed is:

1. A concentrator photovoltaic unit comprising:
   a lens made of resin for collecting sunlight;
   a photovoltaic element which generates electric power upon receiving the light collected by the resin lens;
   a frame-like case made of metal having openings at both end portions thereof and a space formed therein; and
   a holding member for holding the photovoltaic element, wherein
   an outer peripheral portion of the resin lens has a circular or regular polygonal shape, the opening of at least one of the end portions of the metal case has the same shape as the outer peripheral portion of the resin lens, and a center position of the outer peripheral portion of the resin lens and a center position of the opening of the one end portion of the metal case are formed concentrically with each other, and
   the outer peripheral portion of the single resin lens is attached to the opening of the one end portion of the metal case to abut against the metal case so as to collect light onto the photovoltaic element, and the holding member is attached to the opening of the other end portion of the metal case so as to accommodate the photovoltaic element in the metal case, so that the concentrator photovoltaic unit is formed as one unit.

2. The concentrator photovoltaic unit according to claim 1, wherein the resin lens has a shape bulging out in a direction facing an incident direction of the sunlight.

3. The concentrator photovoltaic unit according to claim 1, wherein the opening of the one end portion of the metal case is formed to project from a position against which the outer peripheral portion of the resin lens abuts.

4. The concentrator photovoltaic unit according to claim 2, wherein the opening of the one end portion of the metal case is formed to project from a position against which the outer peripheral portion of the resin lens abuts.

5. A concentrator photovoltaic apparatus comprising a plurality of the concentrator photovoltaic units according to claim 1 that are detachably arranged on a mounting member so as to form a space between the metal cases of the adjacent concentrator photovoltaic units.

6. A concentrator photovoltaic apparatus comprising a plurality of the concentrator photovoltaic units according to claim 2 that are detachably arranged on a mounting member so as to form a space between the metal cases of the adjacent concentrator photovoltaic units.

7. A concentrator photovoltaic apparatus comprising a plurality of the concentrator photovoltaic units according to claim 3 that are detachably arranged on a mounting member so as to form a space between the metal cases of the adjacent concentrator photovoltaic units.

8. A concentrator photovoltaic apparatus comprising a plurality of the concentrator photovoltaic units according to claim 4 that are detachably arranged on a mounting member so as to form a space between the metal cases of the adjacent concentrator photovoltaic units.

9. The concentrator photovoltaic apparatus according to claim 5, wherein the metal cases are formed so that the space formed between the metal cases of the concentrator photovoltaic units becomes gradually wider from the opening of the one end portion of the metal case toward the opening of the other end portion of the metal case.

10. The concentrator photovoltaic apparatus according to claim 6, wherein the metal cases are formed so that the space formed between the metal cases of the concentrator photovoltaic units becomes gradually wider from the opening of the one end portion of the metal case toward the opening of the other end portion of the metal case.

11. The concentrator photovoltaic apparatus according to claim 7, wherein the metal cases are formed so that the space formed between the metal cases of the concentrator photovoltaic units becomes gradually wider from the opening of the one end portion of the metal case toward the opening of the other end portion of the metal case.

12. The concentrator photovoltaic apparatus according to claim 8, wherein the metal cases are formed so that the space formed between the metal cases of the concentrator photovoltaic units becomes gradually wider from the opening of the one end portion of the metal case toward the opening of the other end portion of the metal case.

* * * * *